United States Patent
Fu et al.

(10) Patent No.: US 7,132,861 B1
(45) Date of Patent: Nov. 7, 2006

(54) AMPLIFIER WITH DIGITAL DC OFFSET CANCELLATION FEATURE

(75) Inventors: Wei Fu, San Diego, CA (US); Joseph James Balardeta, Carlsbad, CA (US)

(73) Assignee: Applied MicroCircuits Corporation, San Diego, CA (US)

( * ) Notice: Subject to any disclaimer, the term of this patent is extended or adjusted under 35 U.S.C. 154(b) by 0 days.

(21) Appl. No.: 11/134,867

(22) Filed: May 20, 2005

Related U.S. Application Data

(62) Division of application No. 10/394,845, filed on Mar. 21, 2003, now Pat. No. 6,897,700.

(51) Int. Cl.
*H03F 3/45* (2006.01)

(52) U.S. Cl. .............................. 327/52; 327/54; 327/55; 330/261

(58) Field of Classification Search .................. 330/9
See application file for complete search history.

(56) References Cited

U.S. PATENT DOCUMENTS

| | | | |
|---|---|---|---|
| 3,617,771 A * | 11/1971 | Lee | 327/379 |
| 4,602,169 A * | 7/1986 | Shimizu | 327/73 |
| 5,933,771 A * | 8/1999 | Tiller et al. | 455/333 |
| 5,961,612 A * | 10/1999 | Satoh et al. | 710/10 |
| 6,316,996 B1 * | 11/2001 | Puotiniemi | 330/254 |
| 6,335,651 B1 * | 1/2002 | Fayyaz | 327/359 |
| 6,369,732 B1 * | 4/2002 | Liu et al. | 341/143 |
| 6,724,248 B1 * | 4/2004 | Llewellyn | 330/9 |
| 6,750,717 B1 * | 6/2004 | Kobayashi et al. | 330/279 |
| 6,812,770 B1 * | 11/2004 | Filoramo et al. | 327/359 |
| 2005/0170806 A1 * | 8/2005 | Kim | 455/323 |

* cited by examiner

*Primary Examiner*—Tuan T. Lam
*Assistant Examiner*—Hiep Nguyen
(74) *Attorney, Agent, or Firm*—INCAPLAW; Terrance A. Meador

(57) ABSTRACT

A high speed, high sensitivity post amplifier as described herein includes a digitally-controlled DC offset cancellation feature. The amplifier circuit is configured to provide DC offset voltage levels in response to a digital control signal, where the digital control signal is generated based upon a data error metric such as bit error rate. The AC signal path and the DC offset adjustment signal path in the amplifier circuit are separated to facilitate operation with normal power supply voltages, and to achieve low power operation.

8 Claims, 2 Drawing Sheets

AMPLIFIER WITH DIGITAL DC OFFSET CANCELLATION FEATURE

RELATED APPLICATION

This is a divisional of U.S. patent application Ser. No. 10/394,845, filed Mar. 21, 2003, now U.S. Pat. No. 6,897,700.

FIELD OF THE INVENTION

The present invention relates generally to electronic circuits. More particularly, the present invention relates to high speed post amplifiers such as those utilized in telecommunication and data communication systems.

BACKGROUND OF THE INVENTION

The presence of DC offset in a data signal can be a significant problem in high speed, high sensitivity, post amplifiers utilized in optical communication systems. In general, two distortion sources can contribute to DC offset in an amplified data signal: (1) the DC offset already present in the input data signal, which may be caused by duty cycle distortion, data pattern irregularities, or practical limitations of the communication system components; and (2) internal DC offset generated by the amplifier circuit itself, which is caused by asymmetry or mismatching of the amplifier devices. When a low level data signal is amplified by a highly sensitive amplifier circuit, even small amounts of DC offset can significantly degrade the quality of the amplified data signal.

The prior art contains several DC offset cancellation techniques that address the problem of DC offset in a processed data signal. Typically, such prior art techniques suffer from one or more of the following shortcomings: (1) limited to the cancellation of "internal" DC offset generated by the amplifier circuit, and not able to cancel "external" DC offset that may be present in the amplifier input signal; (2) the need for off-chip components; (3) high operating power requirements; and (4) limited to relatively low speed operation, e.g., below 1 Gbps (especially for practical CMOS implementations).

BRIEF SUMMARY OF THE INVENTION

The invention may be implemented as a high speed, high sensitivity post amplifier having a DC offset cancellation feature that requires a low amount of power. Such a post amplifier includes a DC offset cancellation structure that employs very low power offset adjusting elements. The amplifier cancels different types of DC offset (offset that is present in the input signal and offset that is generated by the amplifier circuit itself). The DC offset cancellation feature is driven by digital control signals that can be generated in response to system or subsystem level digital processing and/or software techniques. In one implementation, the DC offset cancellation feature requires no off-chip components, which facilitates a low cost solution. Unlike prior art devices, an amplifier configured in accordance with the invention can operate at high speeds, e.g., 11.2 Gbps, using 0.13 µm transistor technology. Such an amplifier can be configured to receive differential or single-ended data input signals.

The above and other aspects of the present invention may be carried out in one form by an amplifier device comprising: a semiconductor substrate; an amplifier circuit formed on the semiconductor substrate, the amplifier circuit being configured to receive an input data signal and to amplify the input data signal into an output data signal, the amplifier circuit incorporating a DC offset cancellation structure; and a digital-to-analog converter ("DAC") formed on the semiconductor substrate and connected to the amplifier circuit, the DAC being configured to receive a digital control signal and to convert the digital control signal into an analog DC offset control signal utilized by the DC offset cancellation structure.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps. It should be appreciated that such functional blocks may be realized by any number of hardware, software, and/or firmware components configured to perform the specified functions. In addition, those skilled in the art will appreciate that the present invention may be practiced in conjunction with any number of communication systems and that the particular amplifier circuit arrangement described herein is merely one exemplary application for the invention.

It should be appreciated that the particular implementations shown and described herein are illustrative of the invention and its best mode and are not intended to otherwise limit the scope of the invention in any way. Indeed, for the sake of brevity, conventional aspects of the circuits (and the individual operating components of the circuits) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

The following description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits are not adversely affected).

As used herein, a "node" means any internal or external reference point, connection point, junction, signal line, conductive element, or the like at which a given signal, logic level, voltage, data pattern, current, or quantity is present.

Furthermore, two or more nodes may be realized by one physical element (and two or more signals can be multiplexed, modulated, or otherwise distinguished even though received or output at a common node).

Figure 1:
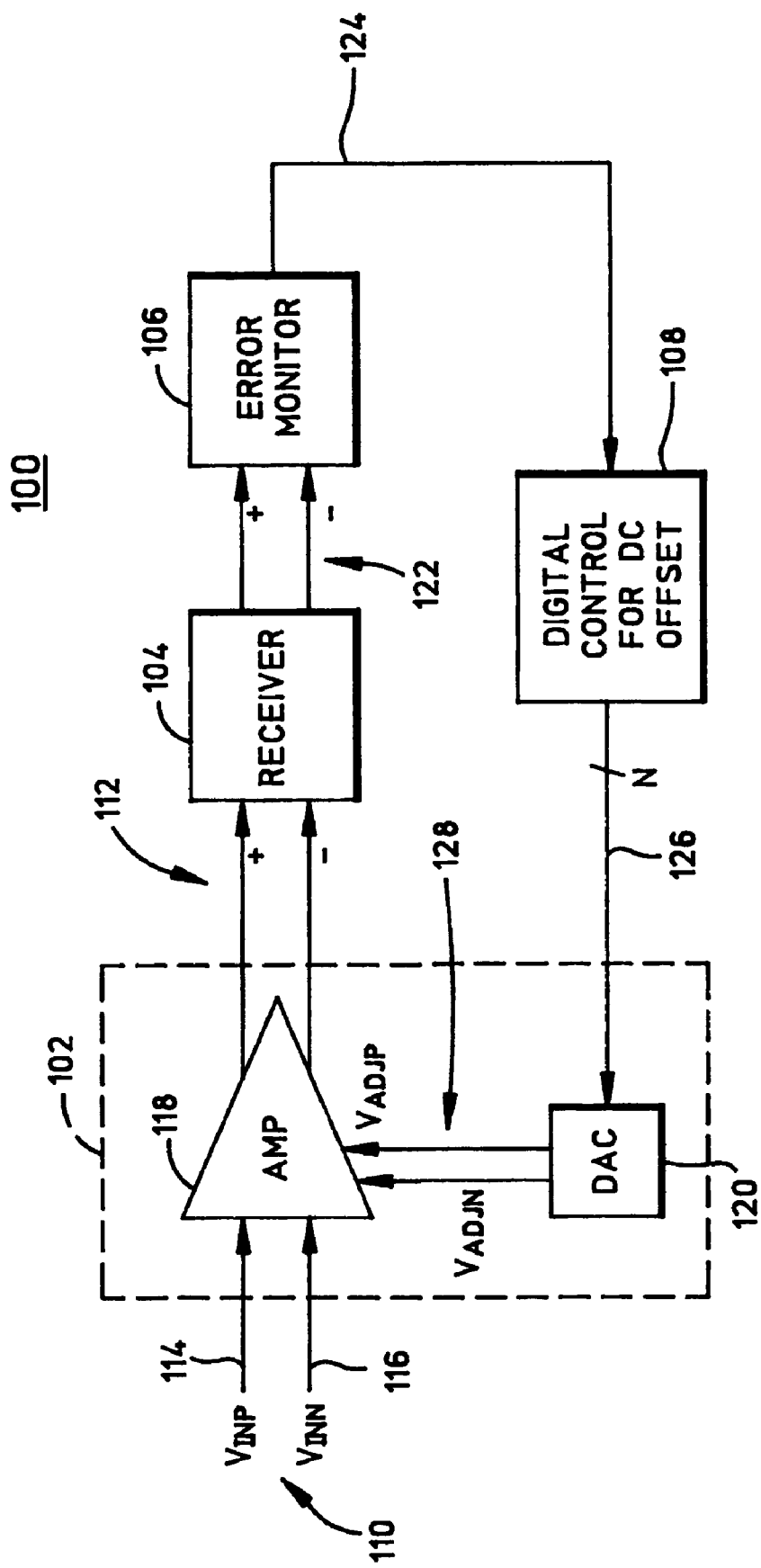
FIG. 1 is a schematic representation of a DC offset cancellation architecture for an amplifier circuit.

FIG. 1 is a high level schematic representation of a DC offset cancellation architecture 100 suitable for use with an amplifier device 102. This architecture 100 also includes at least a receiver component 104 connected to amplifier device 102, an error monitor 106 connected to receiver component 104, and a digital control component 108 connected to error monitor 106. In accordance with one practical implementation, amplifier device 102 is realized on a single chip or semiconductor substrate, and the other illustrated components are realized "off chip" or external to the chip upon which amplifier device 102 is formed. The general scheme depicted in FIG. 1 can be deployed in the context of a number of practical applications. For example, one practical application employs a high speed, high sensitivity post amplifier for amplifier device 102, where the input to the post amplifier is a relatively low level signal received from a transimpedance amplifier in an optical data communication system.

The amplifier device/arrangement 102 is configured to receive an input data signal 110, and amplify the input signal into an output data signal 112. In FIG. 1, input data signal 110 is depicted as a differential signal having a positive component 114 and a negative component 116, and output data signal 112 is also depicted as a differential signal. Amplifier device 102 may be designed to accommodate a single-ended input data signal where one of the two differential inputs is left "floating" with no input. Amplifier device 102 includes an amplifier circuit 118 and a digital-to-analog converter ("DAC") 120 connected to amplifier circuit 118. Amplifier circuit 118 includes a DC offset cancellation structure (not shown in FIG. 1) that is responsive to the analog output of DAC 120. In this regard, amplifier device 102 incorporates a digitally-controlled DC offset cancellation feature.

Amplifier device 102 can be employed to increase the level of input data signal 110 for compatibility with receiver component 104, which may require a minimum input signal amplitude for proper and/or reliable operation. In practical embodiments, receiver component 104 processes its input signal in accordance with the system or subsystem requirements. For example, receiver component 104 may be a timing and data recovery receiver. The input signal to receiver component 104 is based on output data signal 112 (in the example embodiment, output data signal 112 corresponds to the input signal for receiver component 104). Receiver component 104 generates a receiver output signal 122 (depicted as a differential signal) in response to the receiver input signal. Notably, if output data signal 112 contains excessive DC offset, then errors may be introduced into the signal processed by receiver component 104.

Error monitor 106 is configured to measure an error metric, such as the bit error rate or other data error quantity, associated with receiver output signal 122. For example, the error metric may be derived from, or otherwise based on, the output of a CDR component, which can be analyzed for DC balance. Error monitor 106 may incorporate known techniques and processes to generate an error indication 124 that represents the error metric. Digital control component 108 receives and processes error indication 124 (or a signal derived from error indication 124) to generate a digital control signal 126. Thus, during normal operation, digital control signal 126 is generated in response to the error metric measured by error monitor 106. In a preferred practical embodiment, digital control component 108 is implemented in software, which facilitates use of a flexible digital search algorithm at the system or subsystem level. Digital control component 108 may be a programmable software element or module or a component that is configured to facilitate "manual" adjustment or setting. A manual adjustment feature may be desirable for purposes of initialization, calibration, or diagnostics.

In the practical embodiment, digital control signal 126 is an N-bit digital word, where N is selected according to the desired DC offset adjustment resolution, the DC offset voltage range, and/or other application-specific requirements. In accordance with typical embodiments, digital control signal 126 is a digital word having 6–12 bits. The current state of digital control signal 126 regulates the amount of DC offset cancellation voltage applied by amplifier circuit 118. For example, a practical 6-bit embodiment may utilize the following scheme:

| Control Signal | DC Offset |
|---|---|
| 000000 | +200 mV |
| ... | ... |
| 100000 | 0 mV |
| ... | ... |
| 111111 | −200 mV |

The "DC Offset" values represent the desired amount of DC offset that should be canceled by amplifier circuit 118. These specific voltages represent a typical practical range and are not intended to limit or restrict the scope of the invention.

DAC 120 receives digital control signal 126 (or a digital signal derived from control signal 126) and converts the signal into a suitable analog DC offset control signal 128 that is utilized by the DC offset cancellation structure of amplifier circuit 118. DAC 120 employs conventional design techniques and, for the sake of brevity, well known aspects of its operation are not described herein. In the practical embodiment, analog DC offset control signal 128 is a differential signal having a positive component (labeled $V_{ADJP}$) and a negative component (labeled $V_{ADJN}$). As described in more detail below, analog DC offset control signal 128 can be utilized to control one or more bias current transistors in amplifier circuit 118.

In operation, the DC offset cancellation architecture 100 (amplifier device 102 in particular) receives and amplifies input data signal 110 to produce the output data signal 112. Amplifier circuit 118 functions to amplify input data signal 110 while also adjusting the DC offset of output data signal 112. In the example embodiment, amplifier circuit 118 cancels the DC offset by introducing a specific amount of DC voltage to the output data signal 112, where the DC offset cancellation voltages are controlled by DAC 120, which is controlled by digital control component 108.

Output data signal 112 may be further processed by receiver component 104, and the output of receiver component 104 is analyzed by error monitor 106 to measure an error metric. The error metric indicates the quality of the receiver output and, in turn, the quality of output data signal 112. DC offset in output data signal 112 results in measurable data errors, and, therefore, the error metric is indicative of the amount of DC offset present in output data signal 112.

The error metric is processed by digital control component 108, which generates digital control signal 126 in response to the error metric. The digital control signal 126 is converted by DAC 120 into analog control signals 128, which in turn control the amount of DC offset cancellation voltage generated by amplifier circuit 118. In this manner, a feedback control scheme is created to keep the DC offset voltage within a specified range.

Digital control component 108 can be controlled or regulated at the system or subsystem level, using digital algorithms, software, or the like. In accordance with one example embodiment, the optimum digital setting can be determined as follows. First, digital control component 108 is adjusted to provide the midpoint, i.e., the point corresponding to no DC offset cancellation. Then, the digital setting is increased and decreased to locate two transition points: one where the data error rate changes from high to low; and one where the data error rate changes from low to high. The initial or optimum setting is calculated from the average of the two transition settings. In a practical embodiment, the amount of DC offset cancellation can remain fixed after initialization. Alternatively, the amount of DC offset cancellation (and the corresponding digital control bits) can be dynamically updated over time.

Figure 2:
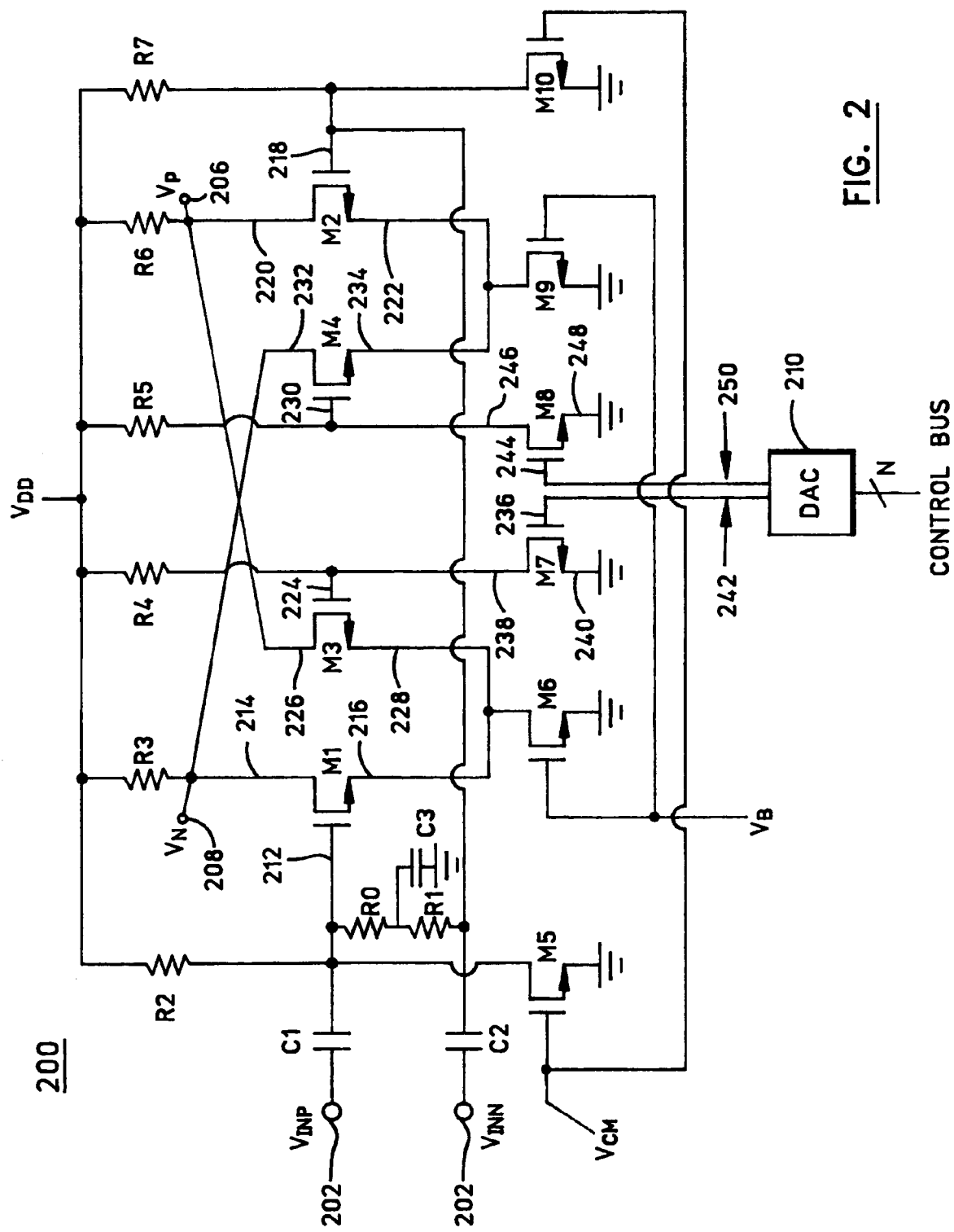
FIG. 2 is a schematic representation of an amplifier stage that includes a DC offset cancellation structure.

FIG. 2 is a schematic representation of an amplifier stage 200, which may be incorporated into an amplifier circuit or arrangement such as amplifier device 102. For the sake of brevity and clarity, FIG. 2 does not show additional amplifier stages, which may be employed in a practical embodiment. Such additional amplifier stages can be designed and implemented in accordance with conventional techniques. In general, amplifier stage 200 receives an input signal (which may be differential or single ended), amplifies the input signal while adjusting DC offset, and generates a differential output signal that represents the amplified input signal summed with the DC offset adjustment voltage. The output signal is provided at two output nodes for connection to additional amplifier stages as necessary. The following description assumes that the input data signal is differential. For single-ended inputs, amplifier stage 200 also functions as a single-to-differential signal converter.

Amplifier stage 200 generally includes a positive input node 202, a negative input node 204, a positive output node 206, a negative output node 208, coupling capacitors (labeled C1 and C2), matching resistances R0 and R1, a number of load resistances (labeled R2–R7), a number of transistors (labeled M1–M10), and a DAC 210. In this example, amplifier stage 200 is connected to or otherwise receives a supply voltage ($V_{DD}$), a bias voltage ($V_B$), and a common mode control voltage ($V_{CM}$). A practical embodiment of amplifier stage 200 employs MOSFET transistors for transistors M1–M10. These transistors are manufactured using the same transistor technology, e.g., 0.18 micron, 0.13 micron, or the like. Equivalent amplifier circuits may be configured for operation with other transistor types and/or with other suitable active devices or switches.

The values for the resistances and capacitors may vary from application to application. For purposes of this example, the following quantities apply:

| Label | Value |
|---|---|
| C1 | 0.1 μF |
| C2 | 0.1 μF |
| R0 | 50 Ω |
| R1 | 50 Ω |
| R2 | 4 kΩ |
| R3 | 300 Ω |
| R4 | 4 kΩ |

-continued

| Label | Value |
|---|---|
| R5 | 4 kΩ |
| R6 | 300 Ω |
| R7 | 4 kΩ |

The value of matching resistances R0 and R1 are selected according to the transmission line impedance of the input signal impressed on positive input node 202 and/or negative input node 204. In practical high speed data communication applications, where system requirements mandate 50Ω transmission line impedance, R0 and R1 each provide a 50Ω impedance for differential input signals, and 50Ω for single-ended input signals. A coupling capacitor C3 is connected between resistances R0 and R1, as shown in FIG. 2. In a practical embodiment, capacitor C3 is relatively large, e.g., 0.1 μF. The values of the load resistances, which can vary from one practical application to another, are selected according to the desired output signal characteristics, amplifier gain, and respective bias current. In the preferred embodiment, resistance R2 equals resistance R7, resistance R3 equals resistance R6, and resistance R4 equals resistance R5 to ensure symmetrical operation of amplifier stage 200.

Briefly, coupling capacitors C1 and C2 remove the common mode DC component from the input data signal. Transistors M5 and M1, which are biased by the $V_{CM}$ voltage, cooperate with resistances R2 and R7, respectively, to establish a desired common mode voltage in the input data signal. Transistors M6 and M7, which are biased by the $V_B$ voltage, function as respective current sources for transistors M1–M4. These features of amplifier stage 200 are conventional in design and operation.

Transistor M1 includes a gate node 212, a drain node 214, and a source node 216. Gate node 212 serves as a positive input signal node, drain node 214 serves as a current input node for transistor M1, and source node 216 serves as a current output node for transistor M1. Gate node 212 receives the AC-coupled positive component of the input data signal, which may also include a common mode component introduced by transistor M5. In the example embodiment, gate node 212 is connected to one end of resistance R0. Drain node 214 is connected to negative output node 208 and to the supply voltage $V_{DD}$ through resistance R3. In the example embodiment, drain node 214 is directly connected to (and therefore corresponds to) negative output node 208, and resistance R3 is directly connected between $V_{DD}$ and drain node 214.

Transistor M2 includes a gate node 218, a drain node 220, and a source node 222. Gate node 218 serves as a negative input signal node, drain node 220 serves as a current input node for transistor M2, and source node 222 serves as a current output node for transistor M2. Gate node 218 receives the AC-coupled negative component of the input data signal, which may also include a common mode component introduced by transistor M10. In the example embodiment, gate node 218 is connected to one end of resistance R1. In other words, the combination of resistance R0 in series with resistance R1 is connected between the positive input signal node of transistor M1 and the negative input signal node of transistor M2. Drain node 220 is connected to positive output node 206 and to the supply voltage $V_{DD}$ through resistance R6. In the example embodiment, drain node 220 is directly connected to (and therefore corresponds to) positive output node 206, and resistance R6 is directly connected between $V_{DD}$ and drain node 220.

Transistors M1 and M2 are associated with the signal path; these two transistors function to produce an AC component of the output data signal. Briefly, when the differential input signal represents a logic high, then transistor M1 is on and transistor M2 is off. Consequently, transistor M1 causes current to flow through resistance R3, transistor M2 contributes no current flow through resistance R6, and the voltage at positive output node 206 is higher than the voltage at negative output node 208. Conversely, when the differential input signal represents a logic low, then transistor M1 is off and transistor M2 is off. In this state, transistor M2 causes current to flow through resistance R6, transistor M1 contributes no current flow through resistance R3, and the voltage at positive output node 206 is less than the voltage at negative output node 208. The actual amplified output voltage levels are determined by the load resistances R3/R6 and the current generated by the bias current transistors M6/M9.

Transistor M3 includes a gate node 224, a drain node 226, and a source node 228. Gate node 224 serves as a control signal node for transistor M3, drain node 226 serves as a current input node for transistor M3, and source node 228 serves as a current output node for transistor M3. Gate node 224 is connected to $V_{DD}$ through resistance R4; in the example embodiment, resistance R4 is directly connected between $V_{DD}$ and gate node 224. Drain node 226 is connected to positive output node 206; in the example embodiment, drain node 226 is directly connected to (and therefore corresponds to) positive output node 206 and resistance R6 is directly connected between $V_{DD}$ and drain node 226. Source node 228 is connected to source node 216 of transistor M1. In the example embodiment, source nodes 228/216 are directly connected to each other, thus forming a common source node. This common source node is connected to transistor M6, which supplies a suitable bias current.

Transistor M4 includes a gate node 230, a drain node 232, and a source node 234. Gate node 230 serves as a control signal node for transistor M4, drain node 232 serves as a current input node for transistor M4, and source node 234 serves as a current output node for transistor M4. Gate node 230 is connected to $V_{DD}$ through resistance R5; in the example embodiment, resistance R5 is directly connected between $V_{DD}$ and gate node 230. Drain node 232 is connected to negative output node 208; in the example embodiment, drain node 232 is directly connected to (and therefore corresponds to) negative output node 208 and resistance R3 is directly connected between $V_{DD}$ and drain node 232. Source node 234 is connected to source node 222 of transistor M2. In the example embodiment, source nodes 234/222 are directly connected to each other, thus forming a common source node. This common source node is connected to transistor M9, which supplies a suitable bias current.

Transistor M7 includes a gate node 236, a drain node 238, and a source node 240. Gate node 236 serves as a first bias signal node for a first DC offset control signal 242, drain node 238 serves as a current input node for transistor M7, and source node 240 serves as a current output node for transistor M7. Gate node 236 is connected to DAC 210, which generates first DC offset control signal 242 (or a signal upon which first DC offset control signal 242 is based). Drain node 238 is connected to gate node 224 of transistor M3; in the example embodiment, drain node 238 is directly connected to (and therefore corresponds to) gate node 224. Source node 240 may be connected to a reference voltage such as ground.

Transistor M8 includes a gate node 244, a drain node 246, and a source node 248. Gate node 244 serves as a second bias signal node for a second DC offset control signal 250, drain node 246 serves as a current input node for transistor M8, and source node 248 serves as a current output node for transistor M8. Gate node 244 is connected to DAC 210, which generates second DC offset control signal 250 (or a signal upon which second DC offset control signal 250 is based). Drain node 246 is connected to gate node 230 of transistor M4; in the example embodiment, drain node 246 is directly connected to (and therefore corresponds to) gate node 230. Source node 248 may be connected to a reference voltage such as ground.

Transistors M3, M4, M7, and M8, and resistances R4 and R5 cooperate to form a DC offset cancellation structure for amplifier stage 200. Transistors M7 and M8 cooperate to form a bias current architecture, which is configured to receive the analog DC offset control signals and to establish a DC offset cancellation voltage. In this regard, the DC offset cancellation voltage can be taken as the difference in voltage between gate node 224 and gate node 230. Thus, when the voltage at gate node 224 equals the voltage at gate node 230, the DC offset cancellation voltage is zero; when the voltage at gate node 224 is greater than the voltage at gate node 230, the DC offset cancellation voltage is positive; and when the voltage at gate node 224 is less than the voltage at gate node 230, the DC offset cancellation voltage is negative.

As described above, DAC 210 generates the analog DC offset control signals 242/250 in response to the digital control signal. Analog DC offset control signal 242 is utilized as a bias voltage for transistor M7; the current through transistor M7 and resistance R4 varies in response to this bias voltage. Consequently, the voltage at gate node 224 of transistor M3 also varies in response to this bias voltage. In turn, the current through transistor M3 and resistance R6 varies in response to the voltage at gate node 224, which results in an adjustable DC offset component at positive output node 206. Thus, transistor M3 generates a positive component of the DC offset cancellation voltage, which is summed with the positive component of the amplified AC output data signal at positive output node 206. Likewise, analog DC offset control signal 250 controls the adjustable DC offset component at negative output node 208. Thus, transistor M4 generates a negative component of the DC offset cancellation voltage, which is summed with the negative component of the amplified AC output data signal at negative output node 208.

The DC offset adjusting path established by transistors M3 and M4 is "separated" from the signal path in that the current utilized to set the DC offset cancellation voltages need not pass through the matching resistances R0 and R1. Accordingly, the DC offset cancellation feature can be implemented in a practical amplifier without having to rely on a large power supply voltage, and while achieving very low power operation.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An amplifier circuit comprising:
   a first transistor having a positive input signal node and a first current input node;
   a second transistor having a negative input signal node and a second current input node;
   a positive output node connected to said second current input node;
   a negative output node connected to said first current input node;
   a matching impedance connected between said positive input signal node of said first transistor and said negative input signal node of said second transistor;
   a third transistor for generating a positive component of a DC offset cancellation voltage, said third transistor having a control signal node and a third current input node connected to said positive output node;
   a fourth transistor for generating a negative component of said DC offset cancellation voltage, said fourth transistor having a control signal node and a fourth current input node connected to said negative output node; and
   a digitally-controlled bias current architecture connected to said control signal node of said third transistor and to said control signal node of said fourth transistor, said bias current architecture being configured to adjust said positive component of said DC offset cancellation voltage and said negative component of said DC offset cancellation voltage;
   wherein said bias current architecture comprises:
   a fifth transistor having a fifth current input node connected to said control signal node of said third transistor and a first bias signal node for a first DC offset control signal;
   a sixth transistor having a sixth current input node connected to said control signal node of said fourth transistor and a second bias signal node for a second DC offset control signal;
   a first resistance having a first end connected to said control signal node of said third transistor and a second end connected to a supply voltage; and
   a second resistance having a first end connected to said control signal node of said fourth transistor and a second end connected to said supply voltage.

2. An amplifier circuit according to claim 1, wherein said matching impedance is a 100 ohm resistance.

3. An amplifier circuit according to claim 1, further comprising:
   a third resistance having a first end connected to said first current input node of said first transistor, and a second end connected to a supply voltage;
   a fourth resistance having a first end connected to said second current input node of said second transistor, and a second end connected to said supply voltage.

4. An amplifier circuit according to claim 3, wherein said third resistance and said fourth resistance are equal.

5. An amplifier circuit according to claim 1, wherein said first resistance and said second resistance are equal.

6. An amplifier circuit according to claim 1, wherein said bias current architecture comprises a digital-to-analog converter ("DAC") having a first analog output node connected to said first bias signal node, and a second analog output node connected to said second bias signal node, said DAC being configured to:
   receive a digital control signal;
   generate, in response to said digital control signal, said first DC offset control signal at said first analog output node; and
   generate, in response to said digital control signal, said second DC offset control signal at said second analog output node.

7. An amplifier circuit according to claim 6, wherein said digital control signal is an N-bit digital word.

8. An amplifier circuit according to claim 1, wherein:
   said first transistor has a first current output node;
   said second transistor has a second current output node;
   said third transistor has a third current output node;
   said fourth transistor has a fourth current output node;
   said first current output node is connected to said fourth current output node; and
   said second current output node is connected to said third current output node.

* * * * *